(12) United States Patent
Meinhold et al.

(10) Patent No.: US 10,692,921 B2
(45) Date of Patent: Jun. 23, 2020

(54) METHOD OF MANUFACTURING AN IMAGER AND IMAGER DEVICE

(71) Applicant: Infineon Technologies AG, Neubiberg (DE)

(72) Inventors: Dirk Meinhold, Dresden (DE); Emanuele Bruno Bodini, Munich (DE); Felix Braun, Dresden (DE); Hermann Gruber, Woerth A. D. (DE); Uwe Hoeckele, Regensburg (DE); Dirk Offenberg, Dresden (DE); Klemens Pruegl, Regensburg (DE); Ines Uhlig, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/566,171

(22) Filed: Sep. 10, 2019

(65) Prior Publication Data

US 2020/0006418 A1    Jan. 2, 2020

Related U.S. Application Data

(60) Division of application No. 15/586,498, filed on May 4, 2017, now Pat. No. 10,411,060, which is a continuation of application No. 14/186,390, filed on Feb. 21, 2014, now Pat. No. 9,659,992.

(60) Provisional application No. 61/803,998, filed on Mar. 21, 2013.

(51) Int. Cl.
*H01L 27/146* (2006.01)
*H01L 27/148* (2006.01)

(52) U.S. Cl.
CPC .. *H01L 27/14689* (2013.01); *H01L 27/14609* (2013.01); *H01L 27/14627* (2013.01); *H01L 27/14629* (2013.01); *H01L 27/14687* (2013.01); *H01L 27/14806* (2013.01)

(58) Field of Classification Search
CPC ......... H01L 27/14685; H01L 27/14609; H01L 27/14627
See application file for complete search history.

(56) References Cited

U.S. PATENT DOCUMENTS

| | | | |
|---|---|---|---|
| 6,436,747 B1 | 8/2002 | Segawa et al. |
| 7,982,177 B2 | 7/2011 | Nozaki et al. |
| 9,659,992 B2 | 5/2017 | Meinhold et al. |
| 10,411,060 B2 | 9/2019 | Meinhold et al. |
| 2005/0205954 A1 | 9/2005 | King et al. |
| 2006/0115230 A1 | 6/2006 | Komoguchi et al. |
| 2007/0267658 A1 | 11/2007 | Song et al. |
| 2009/0014763 A1 | 1/2009 | Kim et al. |
| 2009/0050947 A1 | 2/2009 | Dungan et al. |
| 2009/0315131 A1 | 12/2009 | Hung et al. |
| 2010/0123811 A1 | 5/2010 | Abe |
| 2011/0073751 A1 | 3/2011 | Ogino et al. |
| 2017/0301721 A1 | 10/2017 | Meinhold et al. |

OTHER PUBLICATIONS

German Office Action dated Nov. 22, 2018, for German Patent Application No. 102014003068.7.

*Primary Examiner* — Errol V Fernandes
(74) *Attorney, Agent, or Firm* — Schiff Hardin LLP

(57) ABSTRACT

Techniques are discloses regarding methods of manufacturing an imager as well as an imager device.

10 Claims, 16 Drawing Sheets

METHOD OF MANUFACTURING AN IMAGER AND IMAGER DEVICE

CROSS-REFERENCE TO RELATED APPLICATIONS

The present application a divisional application of U.S. patent application Ser. No. 15/586,498, filed on May 4, 2017, which is a continuation application of U.S. patent application Ser. No. 14/186,390, filed on Feb. 21, 2014, which claims the benefit of the filing date of provisional U.S. patent application Ser. No. 61/803,998, filed on Mar. 21, 2013, the contents of each of which are incorporated herein by reference in their entireties.

BACKGROUND

Imagers are used in many applications nowadays. This includes 2D CMOS imagers as well as 3D imagers such as 3D depth imagers (3D cameras) which may be based for example on the ToF principle (time-of-flight principle) or other principles. 3D cameras may provide human gesture recognition in natural user interfaces or passenger recognition for automotive safety functions. Distinguished from 2D cameras, 3D cameras for example provide an array of pixel in which each pixel is capable to provide information related to a distance of the object captured by the pixel. Such information may for example be based on a time of flight of light reflected from an object captured by the pixels.

With the implementation of increasing number of pixels on a depth imager chip and the shrinking of pixel sizes going along therewith, the need exist for a concept which allows efficient conversion of light into charge carriers and efficient controlling of the charge carriers in each pixel.

In view of the above it would be beneficial to have a concept which is capable of providing a high degree of efficiency for imagers. In addition, it would be beneficial to have a concept which allows the parallel processing of control electrodes in the optical sensitive areas as well as transistors for an integrated circuit provided for further signal processing.

DETAILED DESCRIPTION

Figure 1:
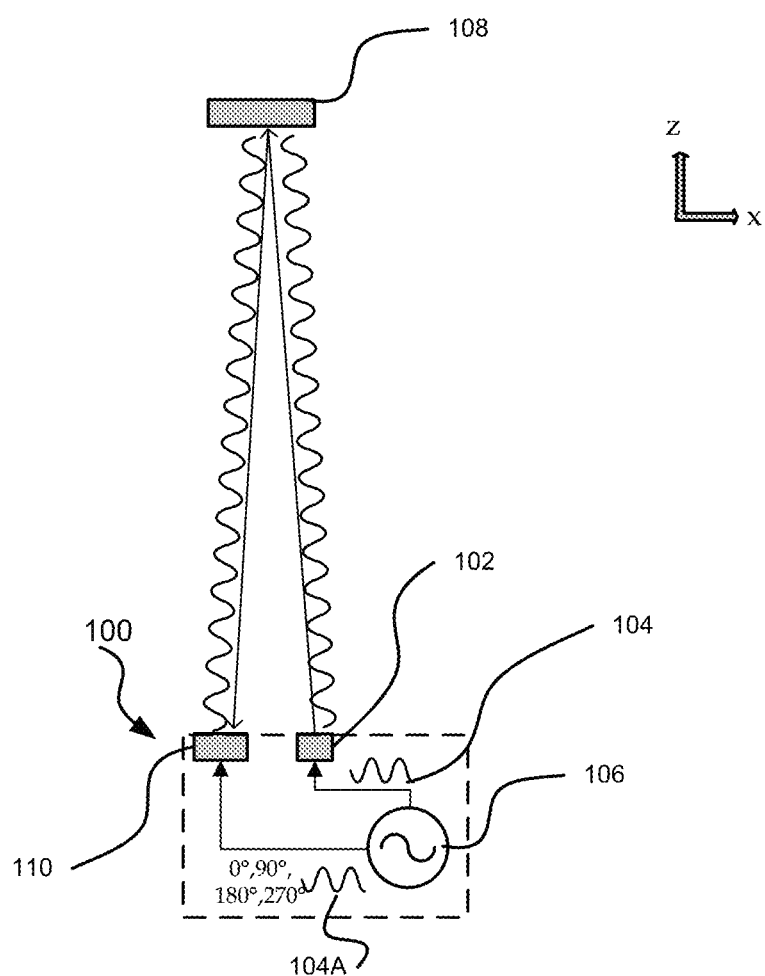
FIG. 1 shows a block diagram of a depth imager system according to an embodiment.

The following detailed description explains exemplary embodiments. The description is not to be taken in a limiting sense, but is made only for the purpose of illustrating the general principles of embodiments while the scope of protection is only determined by the appended claims.

In the exemplary embodiments shown in the drawings and described below, any direct connection or coupling between functional blocks, devices, components or other physical or functional units shown in the drawings or described herein can also be implemented by an indirect connection or coupling unless otherwise noted. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number. Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

In the described embodiments, various specific views or schematic views of elements, devices, features, etc. are shown and described for a better understanding of embodiments. It is to be understood that such views may not be drawn to scale. Furthermore, such embodiments may not show all features, elements etc. contained in one or more figures with a same scale, i.e. some features, elements etc. may be shown oversized such that in a same figure some features, elements, etc. are shown with an increased or decreased scale compared to other features, elements etc.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The term vertical is used in a non-limiting way to describe in embodiments directions vertical or substantially vertical to a surface of a substrate such as a main surface of the substrate. The term lateral is used in a non-limiting way to describe in embodiments directions parallel or substantially parallel to a surface of a substrate such as a main surface of the substrate.

The term substrate used in embodiments may include but is not limited to semiconductor substrates such as a semiconductor die, a stacked die, a semiconductor die with one or more additional semiconductor layers such as epi-layers, polysilicon layers etc.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The embodiments described below are directed to a new manufacturing concept for a depth imager based on the time of flight (TOF) principle such as for example an imager based on the photon mixing principle. Depth imagers may include only one pixel or an array of pixel for determining distances.

In depth imagers based on the photonic mixing principle a phase of reflected light is determined by transmitting modulated light to an object and capturing in each pixel of a pixel array the phase information by mixing the reflected light with a demodulation signal of having the same frequency as the modulated light.

FIG. 1 shows an embodiment of a TOF camera 100 based on the photonic mixing principle. Light generated by a light source 102 is in predetermined time intervals continuously amplitude modulated based on a modulation signal 104 generated by a signal source 106. The modulation signal may include a rectangular waveform, a sine waveform of other signal waveforms. The modulated light signal is provided to determine the distance to an object 108. The modulated light reflected by the object 108 is directed to an imager device 110 which includes pixels as shown for example in the embodiments described with respect to FIGS. 1A, 2A, 3, 4 and 5. In the imager device 110, a signal 104A which corresponds to the modulation signal 104 phase shifted by a predetermined phase, e.g. 0°, 90°, 180° and 270°, is provided to the control electrodes for mixing and demodulation of the reflected light within each pixel. Certain time intervals are assigned for each of the predetermined phases. After integrating the signals in the respective time intervals for each phase 0°, 90°, 180° and 270°, output signals I0, I1, I2, and I3 are obtained corresponding to each phase. Based on the output signals I0, I1, I2, I3, the phase information corresponding to the time to travel can be computed as is known to a person skilled in the art. It is to be noted that the structure of FIG. 2A described below having two read-out nodes at both sides allows to simultaneously obtain the phases I0 and I2 and the phases i1 and I3, respectively.

In the embodiment shown in FIG. 1, the signal 104A is provided phase shifted with respect to the modulation signal 104. It is to be understood that only the relative phase shift of the modulation signal and the demodulation signal is used for measuring the object distance. Therefore, in other embodiments a system with interchanged signals 104 and 104A may be provided in which the modulation signal 104 for the light modulation is phase shifted in different time intervals with respect to the signal 104A which is provided with no phase change.

Figure 2A:
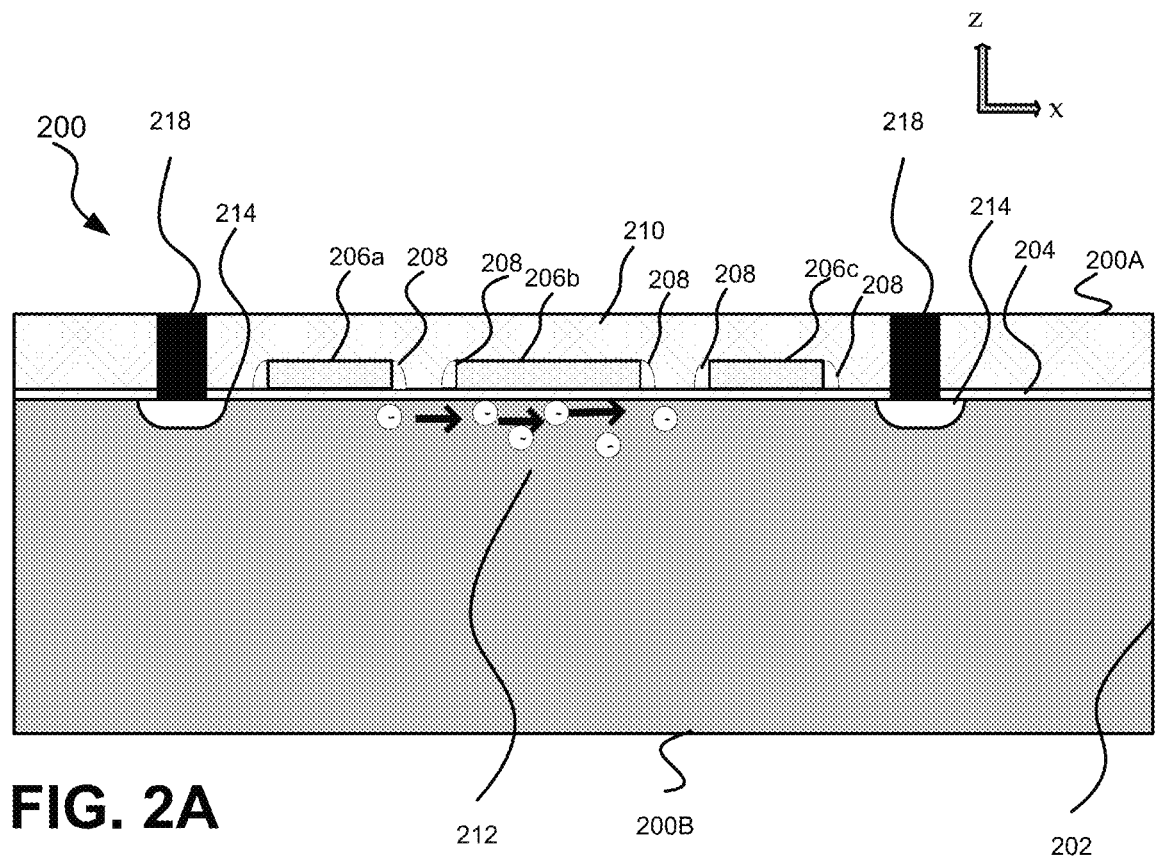
FIG. 2A shows a schematic cross-sectional view according to an embodiment.

FIG. 2A shows an embodiment of a depth imager device 200. FIG. 2A shows a semiconductor substrate 202 having a photo-conversion region 212. The device is configured such that light penetrates into the photo-conversion region 212 and at least a part of the incoming light is converted into charge carriers of both types, i.e. electrons and holes. In some embodiments, the light might be introduced to the photo-conversion region from a front side 200A of the device 200. In other embodiments, the light might be introduced to the photo-conversion region from the back side 200B of device 200. The photo-conversion region may in embodiments extend in vertical direction between 15 μm and 60 μm into the substrate with each value in this range and each sub-range constituting a specific embodiment.

The device 200 further includes an electric insulating layer 204 of insulating material above which a plurality of control electrodes, for example a first control electrode 206a, a second control electrode 206b and a third control electrode 206c are provided. The electric insulating layer 204 is typically provided as thin layer, e.g. a thin gate layer, and may for example include silicon oxide. The elements shown in FIG. 2A show a simplified view of a single pixel of the plurality of pixels typically provided in a depth imager. The control electrodes may form in embodiments the modulation gates of a demodulation structure within a pixel of a continuous wave time-of-flight imager. It is therefore to be noted that in some embodiments multiple pixels are formed within the device resulting in a repetition of the structures and elements shown in FIG. 2A for a single pixel.

Spacers 208 are formed at the side walls of the control electrodes 206a, 206b, 206c. The device 200 may include additional structures which are not shown in FIG. 2A including for example an additional layer for protection of the semiconductor substrate 202 during a spacer etching and further layer deposition, lens structures, passivation structures on the metal stack and reflection structures which will be described further below in more detail.

As can be observed in FIG. 2A, a cover layer 210 extending above the semiconductor substrate 102 is provided to cover the control electrodes 206a, 206b, 206c and spacers 208 as well as other structures. FIG. 2A further shows read out nodes 214 at the lateral side of the pixel in order to collect and read out charges transferred to the respective read out nodes by the control electrodes 206a, 206b, 206c. The read out nodes 214 may be formed in embodiments by a p-n junction region established by providing for example a n-type doped well in a p-type doped substrate 202. The read out nodes 214 are electrically coupled to further circuit elements by a conductive structure 218 in order to allow further processing of the pixel signals.

In the embodiment of FIG. 2A, the second control electrode 206b is arranged between the first control electrode 206a and the third control electrode 206c with respect to a lateral direction (such as the x-direction shown in FIG. 2A). In some embodiments, the second control electrode has a lateral distance to at least one of the first or second control electrodes between 50 nm and 1 µm, where each value within this range and each sub-range forms an embodiment. In some embodiments, the third control electrode has a lateral distance to at least one of the first or second control electrode between 0.1 µm and 0.5 µm. In some embodiments, the second control electrode has a lateral distance to both of the first or third control electrode between 50 nm and 1 µm, where each value within this range and each sub-range constitutes one embodiment. In some embodiments, the second control electrode has a lateral distance to both of the first or third control electrode between 0.1 µm and 0.5 µm.

In embodiments, the control electrodes 206a, 206b and 206c are manufactured such that the control electrodes are transparent or at least semi-transparent to the incoming light generating the charge carriers in the photo-conversion region 212. This may be provided by having a respective thin layer for the control electrodes and/or using material which is transparent or semi-transparent for the incoming light. In some embodiments, the light of operation may be infrared light or near-infrared light. In some embodiments, the light of operation may be visible light.

In embodiments, the control electrodes 206a, 206b, 206c are electrodes to direct the photo-generated charge carriers in a lateral direction towards the read out nodes 214 based on the electric potentials present at the respective control electrodes 206a, 206b, 206c. In embodiments, the electric potentials at the control electrodes 206a, 206b, 206c causes the generating of time-varying space charge regions in semiconductor regions below the respective control electrode. As will be described further below, the device 200 is capable to generate space charge regions of different extensions below the respective control electrodes 206a, 206b, 206c based on the respective electric potential present at the control electrode. Below a respective control electrode, the extension of the space charge region and therefore the electric potential is approximately constant while in the region between two adjacent control electrodes with different space charge extensions electric drift fields are generated. As a result a potential distribution for photo-generated charge carriers is generated in the semiconductor region near the substrate surface causing drift fields in a lateral direction depending on the electric potentials present at the control electrodes 206a, 206b, 206c.

Figure 2B:
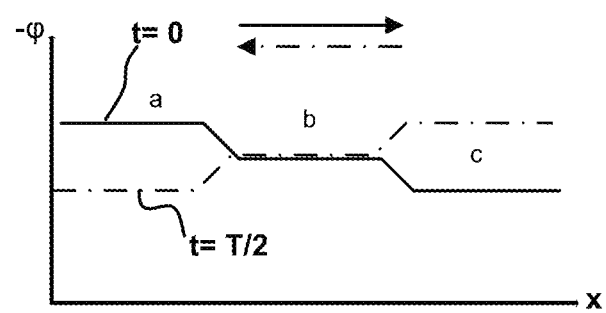
FIG. 2B shows a diagram of an operation according to an embodiment.

FIG. 2B shows a diagram resulting from an example operation of the control electrodes 206a, 206b and 206c of FIG. 2A according to an embodiment. FIG. 2B shows as abscissa the electric potential distribution as negative electric potential caused by the control electrodes 206a, 206b, and 206c in the semiconductor regions below the control gates. The negative electric potential corresponds to the potential energy seen by photo-generated electrons (negative charges) which are in the described embodiments the charge carriers to be transferred by the control electrodes 206a, 206b, 206c.

As can be seen, the potential applied to the first control electrode 206a (indicated in FIG. 1B by "a") varies such that a maximum of the potential energy is obtained at time t=0 and a minimum is obtained at time t=T/2. The second control electrode 206b (indicated in FIG. 1B by "b") is kept constant. It can be seen at both times t=0 and t=T/2, the potential distribution is a step-wise such that for the control electrode 206b arranged between the control electrodes 206a and 206c the potential of the control electrode 206b is also between the potential of the control electrodes 206a, 206c. The use of two control electrodes driven by time-varying signals while one of the control electrodes is maintained at a constant electric potential provides the required step-wise potential distribution in a very power-efficient manner since no time-varying driving signal has to be applied to the control electrode 206b.

It is to be noted that the number of steps in the potential distribution generated by the control electrode configuration can be increased by adding additional control electrodes. If the number of control electrodes is K, the number of steps in the potential distribution adds up to K+1.

In the operation described above, the generated charge carriers may be guided by the electric field generated by the control electrodes to read out nodes which are arranged lateral to the control electrode structure. In other words, the control electrode arrangement is capable to provide a bidirectional transfer to each lateral side once the charge carriers reach the influence zone of the control electrodes. In optical time-of-flight sensors the controlling of the charge carriers is time critical since the operation depends on the timely transportation of the charge carriers to the laterally arranged read-out nodes.

In conventional systems, charge carriers generated inside the photo-conversion region move by diffusion from the origin of the charge generation to the influence zone of the control electrodes 206a, 206b, 206c. In some embodiments, doping profiles may be provided in the substrate 202 to generate build-in fields for providing accelerated movement of the charge carriers. In such embodiments, drift movement is provided for the charge carriers. Only at the influence zone of the control electrodes 206a, 206b, 206c, the charge carriers are then subjected to electric fields which cause the lateral transfer to the read out nodes 214 based on the corresponding potential distribution applied to the control electrodes 206a, 206b, 206c.

Referring now to FIGS. 3A-3G, an embodiment of manufacturing an imager such as the depth imager shown in FIG. 2A is described. It is to be noted that FIGS. 3A-3G show on the left hand a pixel region of the substrate which later forms a pixel of the imager such as the region including control electrodes 206a and 206b and on the right hand side a transistor region of the substrate in which one or more transistors are formed in parallel to the pixel. The transistor region may include transistor MOS-transistors, CMOS transistors or other types of gate controlled transistors as well as other transistors. It is also to be understood that the FIGS. 3A-3G are not drawn to scale but rather show schematically some elements and the way they are processed in a comprehensive manner. It is further to be understood that between consecutive figures one processing step or multiple processing steps which are not shown may be applied, such as for example the deposition and structuring of a masks, an etching through a masks and a removal of a masks.

Figure 3A:
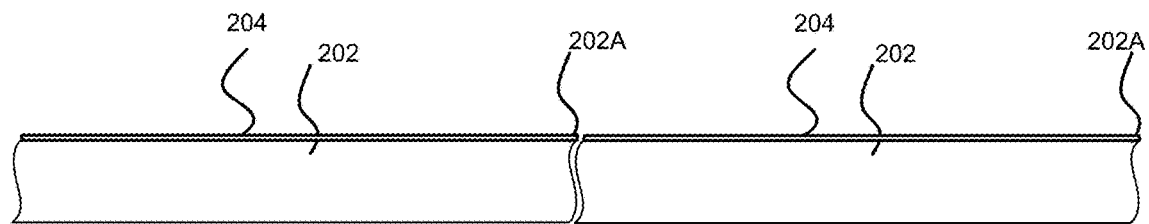
FIGS. 3A to 3G show schematic cross-sectional views according to an embodiment.

FIG. 3A shows the substrate 202 with the electric insulating layer 204 formed at a main surface 202A of the substrate 202. The electric insulating layer 204 may include a single layer or a layer stack of different materials. In some embodiments, the electric insulating layer 204 may comprise an oxide material such as a thin layer of silicon oxide. The electric insulating layer 204 may for example be formed by a thermal oxide process applied to substrate 202 or other oxide processes. The electric insulating layer 204 provides in the finished imager an electric isolation of the control electrodes in the pixel region to allow manipulation of photo-generated charge carriers at the substrate interface and a gate isolator in the transistors region for transistor operation.

It is to be noted here that the substrate 202 may be pre-processed to include additional structures, layers, etc. In other words, the substrate 202 may include not only a semiconductor substrate of crystalline material but for example also composite substrates, substrates with wells of different doping, additional layers, structures etc. Typically, the substrate 202 may comprise a p-doped silicon but other doping types and substrate materials may be used in other embodiments. An embodiment of providing a p-doping substrate is described further below with reference to FIG. 9.

Figure 3B:
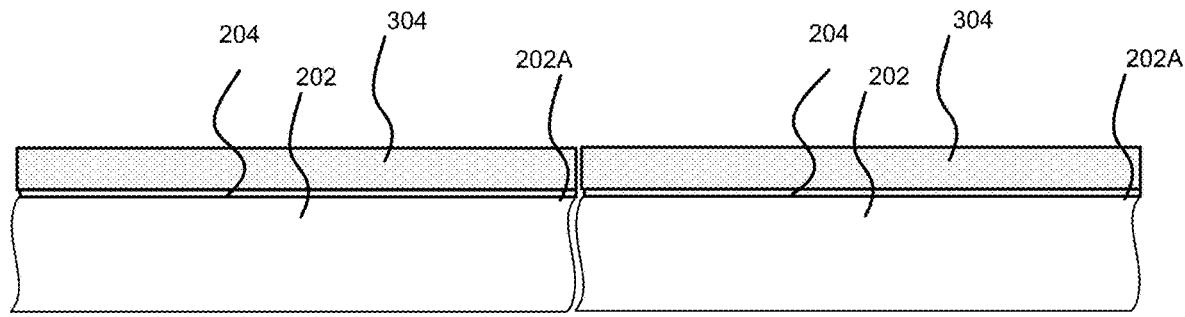

FIG. 3B shows the structure of FIG. 3A after a conductive layer 304 has been deposited on the electric insulating material 204 which later forms the control electrodes in each pixel of the imager device and the gate electrodes in the transistor region.

Figure 3C:
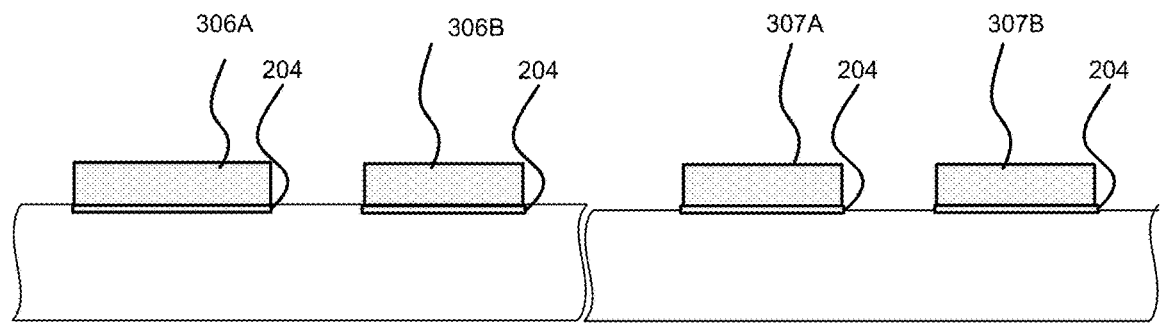

FIG. 3C shows the conductive layer 304 of FIG. 3B after structuring into control electrode structures 306A and 306B and gate electrode structures 307A, 307B. The control electrode structures 306A and 306B in the pixel region may for example correspond to the control electrodes 206A and 206B shown in the depth imager device of FIG. 2A. While only two control electrode structures are shown, it is to be noted here that in addition to the control electrode structures 306A and 306B further control electrode structures may be formed in each pixel of the depth imager device such as for example a control electrode structure to form a control electrodes 296A, 206B and 206C as shown in FIG. 2A.

Structuring the conductive layer 304 may include the generation of a hard mask, the structuring of the hard mask an etching through the hard mask to selectively remove the conductive layer 304 and a removing of the hard mask. Furthermore, as shown in FIG. 3C, the insulating layer 204 may be removed in regions outside of the control electrode structures 306A and 306B and gate electrode structures 307A, 307B. The selective removing of the insulating layer 204 may for example be provided simultaneous with an etching of the hard mask used for structuring the control electrode structures 306A and 306B and gate electrode structures 307A, 307B.

Figure 3D:
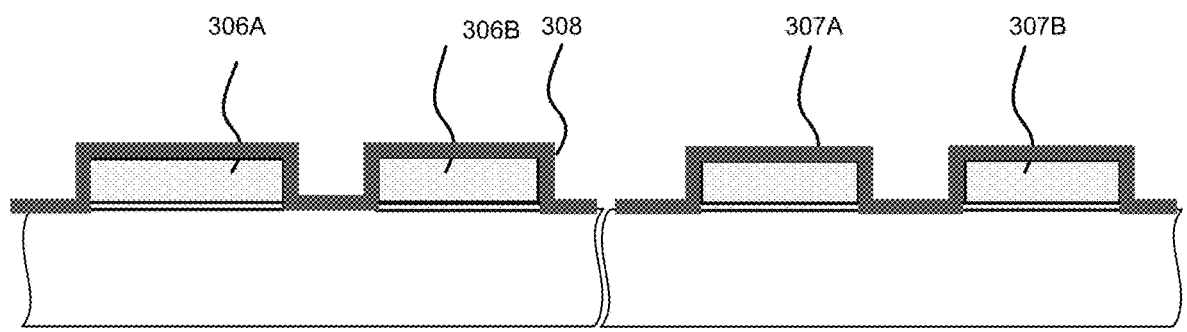

With reference to FIG. 3D, a layer 308 is deposited. In the described embodiment, the layer 308 overlays the control electrode structures and gate electrode structures as well as the regions between adjacent control electrode structures and the regions between adjacent gate electrode structures. In embodiments, the layer 308 may be a layer deposited conformal and continuous over the structures of the substrate 202. In embodiments, the layer 308 provides protection for the substrate 202 in the pixel region between the control electrode structures 306A and 306B during a spacer etch back as will be described further below. This allows to achieve improved conversion efficiency in the pixel regions since the concentration of impurities or other defects introduce by the spacer etch back is reduced significantly in the region extending between the control electrode structures 306A and 306B. The layer 308 is removed in the transistor area to allow the formation of spacer structures and a substrate doping by using the spacer structures to form transistors. Since in embodiments the protection layer remains in the pixel region between adjacent control electrodes during all further processing steps or at least some further processing steps, the layer 308 further protects the substrate interface in the pixel area from contamination and damages also for the following processing steps. For example, protection in the pixel area from contamination of the substrate interface by dopants used in doping the transistor area can be achieved. Therefore, the number of recombination centers existing at the substrate interface in the pixel area which reduce an efficiency of the device can be reduced compared to a process in which the pixel region is not protected by the layer 308 and therefore subjected to the spacer etch back or dopants in the same way as the transistor region. The layer 308 therefore allows to use the same processing steps for forming the control structures in the pixel region and for forming the control structures in the transistor region without damaging the substrate interface in the pixel area by the processing steps needed in the transistor area for example to obtain prober doping by using the spacer structures.

The layer 308 provides in addition synergetic effects in manufacturing the device since electric effects which are caused by permanently charged layers formed later on in the manufacturing process above the substrate are weakened in view of the additional distance provided by the layer 308 to these charged layers. Charged layers may influence for example through their electric field photo-generated charge carriers and may for example reduce the number of photo-generated charge carriers which reach the influence zone of the control electrodes 208A, 208B close to the substrate interface. Thus, the efficiency of a pixel manufactured by embodiments herein described can further be enhanced. Overall, a pixel for an imager device can be formed with improved efficiency since less photo-generated charge carriers are recombining at impurities or defects. This may for example be of significant importance when shrinking down to small sized pixel areas in current and future high density pixel depth imagers. Better protection is achieved when layer 308 is made thick. However thickness of the layer 308 is restricted in view of the modern processing techniques and small sized distances between adjacent control electrode structures. For typical modern CMOS-processing techniques, a range of thickness from 10 nm (nanometer) up to 100 nm allows to obtain good results in efficiency. In some embodiments, the range of thickness may be between 20 and 50 nm allowing the manufacturing of small sized pixels with sufficient protection. In some embodiments, the layer 308 comprises oxide material such as silicon oxide. Oxide material may provide additional synergetic effects in manufacturing since permanent charging effects during deposition within the layer are reduced. As outlined above, such charging effects may affect the photo-generated charge carriers.

As described above, the layer 308 extends at least in the region between the control electrode structures 306A and 306B in order to provide protection for the substrate interface. However as shown in FIG. 3D, the layer 308 may also overlay the control electrode structures 306A and 306B. In other embodiments of more than two control electrode structures per pixel, the layer 308 may be deposited in each region extending between two adjacent control electrode structures. In some embodiments, the layer 308 may extend in each region between two adjacent control electrode structures and further overlaying each of the control electrode structures.

Figure 3E:
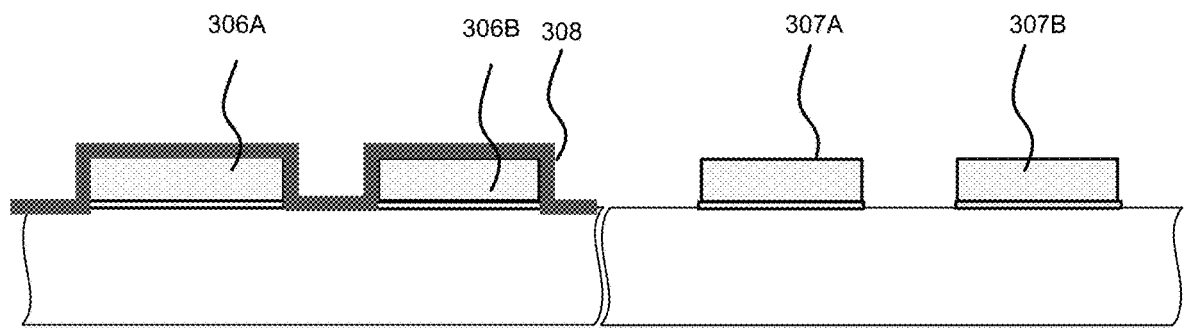

With reference to FIG. 3E, the layer 308 is then completely removed in the transistor region.

Figure 3F:
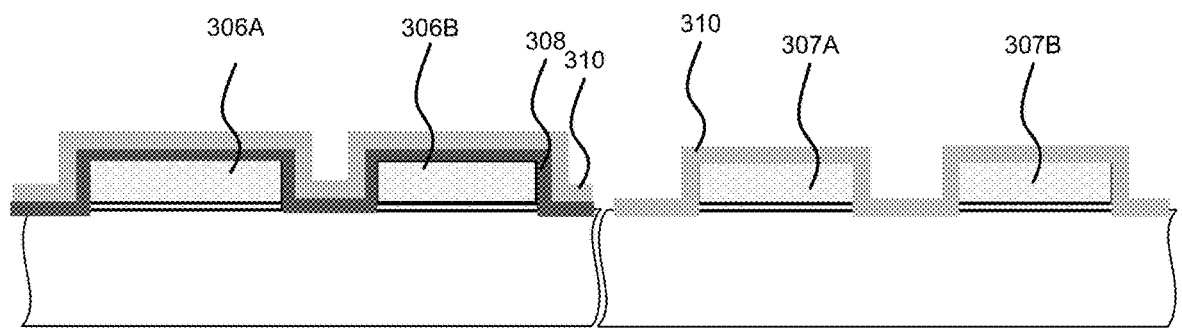

As shown in FIG. 3F, a spacer layer 310 is formed. The spacer layer 310 extends in the pixel area directly interfacing the layer 308 while the space layer extends in the transistor region interfacing the substrate in the region between the gate electrode structures 307A, 307B and interfacing the top and sidewall surfaces of the gate electrode structures 307A, 307B. Thus as can be seen in FIG. 3F, the layer 308 is in the pixel region sandwiched between the surfaces of the control electrode structures 306A, 306B and the spacer layer 310. In the region between the control electrode structures 306A, 306B, the layer 308 is sandwiched between the substrate 202 and the spacer layer 310.

In some embodiments, the spacer layer 310 may comprise at least first and second sublayers or more than 2 sublayers. The first and second sublayers may have a same material or may have different materials. In some embodiments, similar to layer 308, a further layer 312 may be formed between the first and second sublayers of spacer layer 310 to provide protection as described above. In some embodiments, instead of forming the layer 308 to be below the spacer layer 310, the layer 308 may be formed between sublayers of a spacer layer. In some embodiments, the spacer layer 310 includes oxide or nitride material. In some embodiments, in which multiple sublayers are used and each sublayer is etched back, the sublayer directly interfacing the layer 308 has a material different than the material of the layer 308 while other sublayers not directly interfacing the layer 308 may have a same material as layer 308.

Figure 3G:
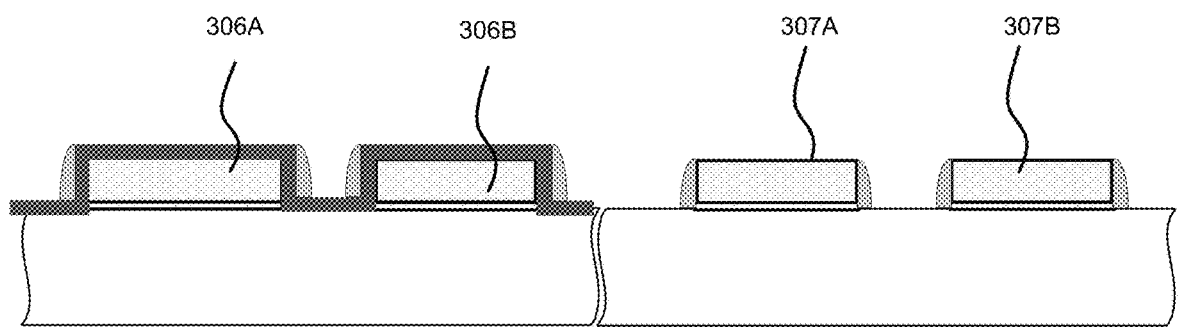

Referring now to FIG. 3G, the spacer layer 310 is etched back to generate spacer structures 312 at sidewalls of the control electrode structures 306A, 306B. As outlined already above in detail, during the etch back, the layer 308 protects the substrate region between the control electrode structures 306A and 306B. In some embodiments of a spacer layer with sublayers, each sublayer may be subjected to an etch back process while the layer 308 still protects the substrate region in the pixel region between the control electrodes 306A, 306B. Then a doping may be performed to obtain doped regions in the transistor area. Again in view of the layer 308 maintained in the pixel area, the substrate is protected in the pixel area from being contaminated by dopants without having to apply any additional protection layers.

Afterwards the manufacturing of the device is continued as is known to a person skilled in the art including the finishing of the FEOL (front end of line), MEOL (middle end of line) and BEOL (Back end of line).

Referring now to FIGS. 4A-4I, a further embodiment is described. In this embodiment, a first spacer layer is deposited before the layer 308 is generated and structured.

Figure 4A:
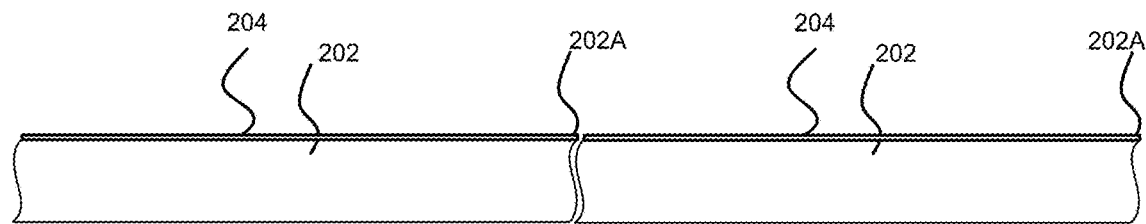
FIGS. 4A to 4I show schematic cross-sectional views according to an embodiment.
Figure 4B:
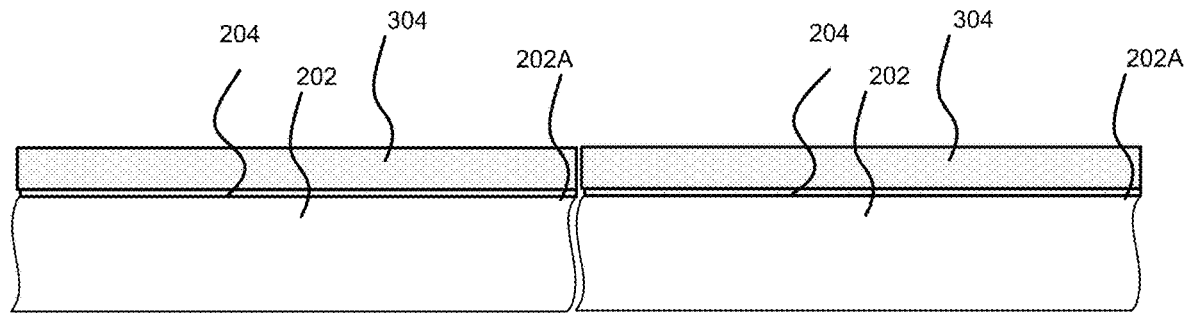
Figure 4C:
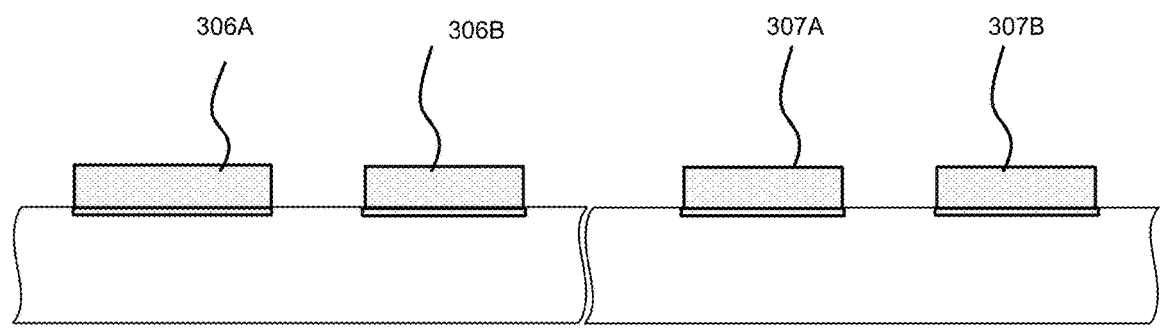

FIGS. 4A to 4C are identical with FIGS. 3A to 3C and therefore reference is made to the detailed description above.

Figure 4D:
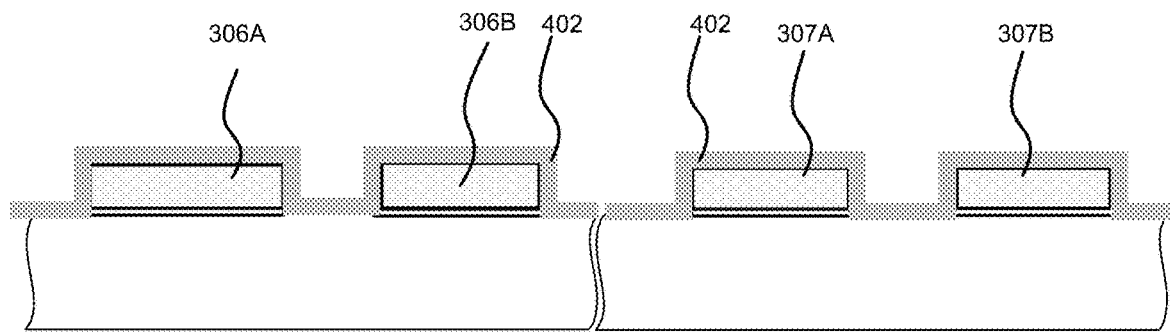
Figure 4E:
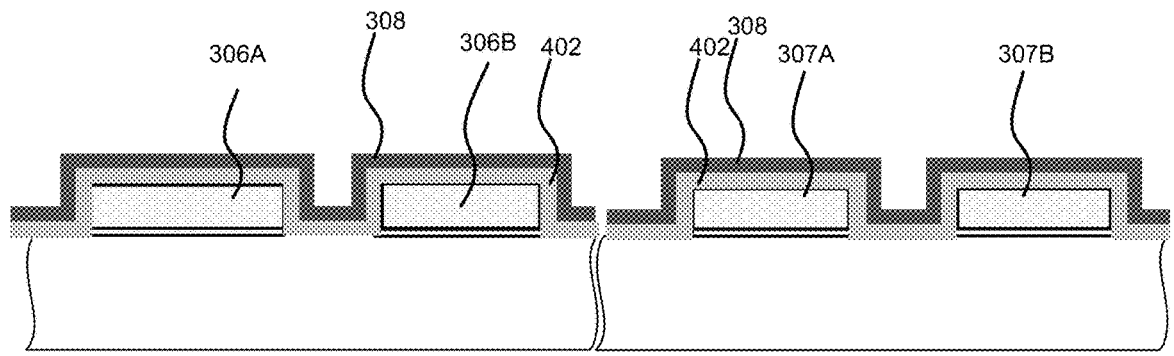
Figure 4F:
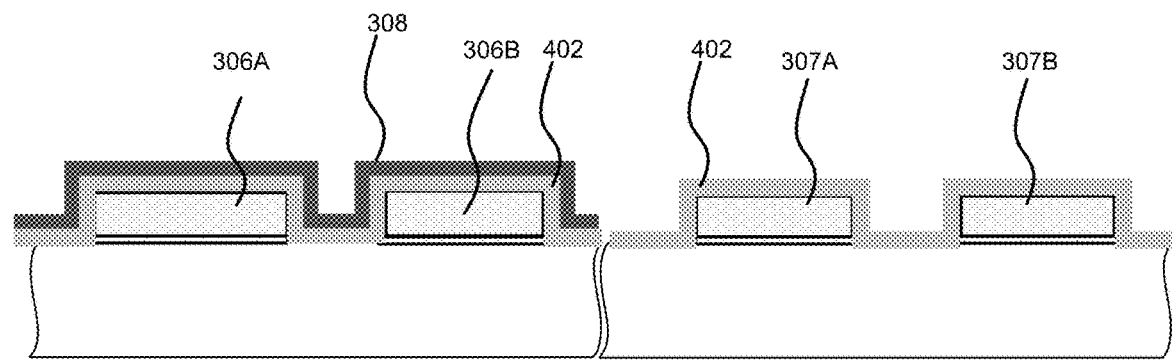
Figure 4G:
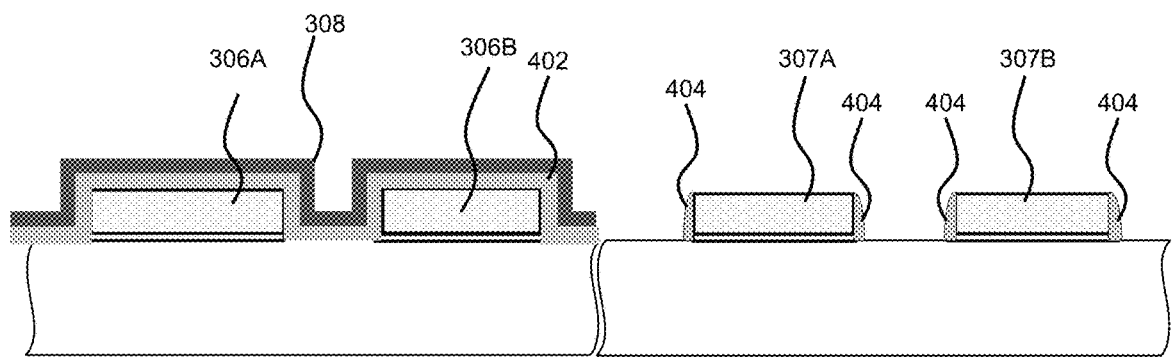

With reference to FIG. 4D, a first spacer layer 402 is deposited conformal above the structures and the substrate in the pixel region and in the transistor region. As shown in FIG. 4E, the layer 308 is then deposited on the first spacer layer 402. Then the layer 308 is removed in the transistor region for example by selective etching against the first spacer layer 402. FIG. 4F shows the resulting structure in which the layer 308 extends above the first spacer layer 402 in the pixel region while the layer 308 is removed in the transistor region. A first spacer etch back is applied which forms spacer structures 404 at least at the side walls of the gate electrodes 307A 307B. While FIG. 4G shows the spacer structures 404 at side walls of the gate electrode structures 307A, 307B, it is to be understood that parts of the spacer layer 402 may also remain in other areas, for example above the gate electrode structures 307A, 307B. It is further to be noted that in view of the layer 308 not removed in the pixel region and covering the spacer layer 402, the spacer layer 402 provides protection for future processing steps in the pixel region.

Figure 4H:
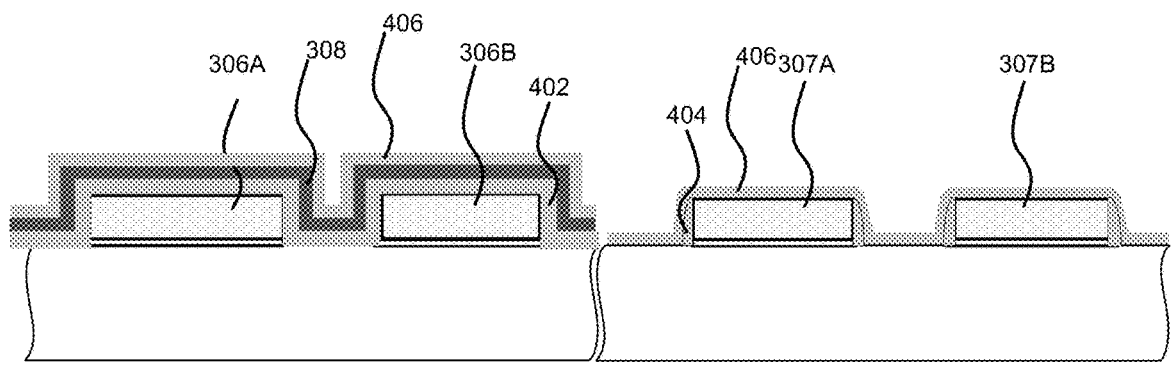
Figure 4I:
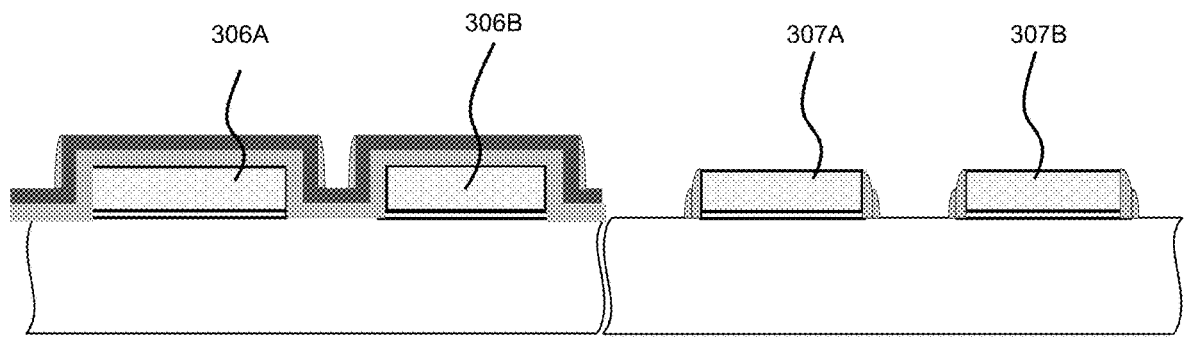

With reference to FIG. 4H, after the etching back of the first spacer layer 402, a second spacer layer 406 is deposited in the pixel region and the transistor region. The second spacer layer 406 is etched back and forms spacer structures 408 at sidewalls in the pixel region and the transistor region which are shown in FIG. 4I. With the spacer structures 404 and 408 formed in the transistor region, a doping is performed to generated doped regions in the transistor regions. Other processing steps are provided to continue with the further processing for manufacturing the imager device.

It is to be understood that each of the spacer layers 404 and 408 may include in other embodiments multiple sublayers of a same or different material. Thus, in some embodiments each of the sublayers may be separately deposited and subjected to an etch-back in order to form additional spacer structures.

After the spacer structures have been formed, additional processing includes the manufacturing of a metal stack in the BEOL. Typically, a passivation layer is provided on top of the metal stack for protection purposes.

Embodiments described herein may use instead of a single passivation layer at least two passivation layer.

According to some embodiments, the passivation layer on top of the metal stack can be provided in a manner to provide in addition antireflection coating behavior. According to some embodiments which are described below, in order to achieve an antireflection coating behavior of the passivation layer, the passivation layer has a reduced thickness in the light sensitive area compared to other areas. To achieve this, the passivation layer may include a multiple-layer stack where at least one layer is removed in the light sensitive areas to allow a matching of the passivation layer in the light sensitive area to achieve antireflective coating behavior.

Figure 5A:
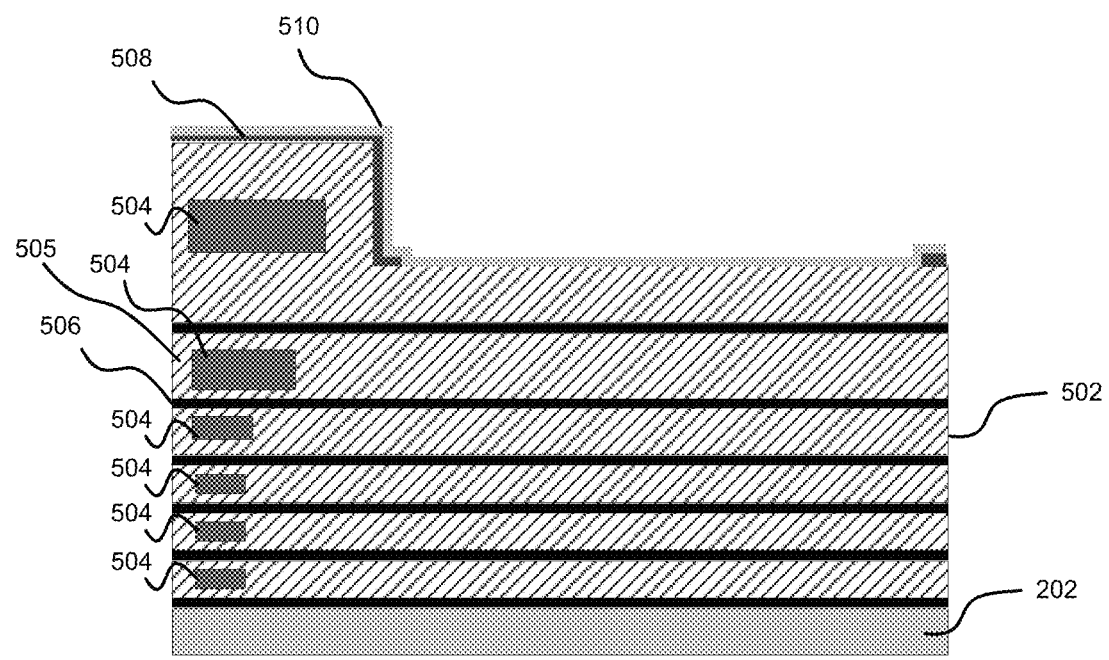
FIGS. 5A to 5C show schematic cross-sectional views according to an embodiment.

FIG. 5A shows a first embodiment in which above the substrate 202 a metal layer stack 502 is generated. The layer stack 502 comprises a plurality of metal layers 504 which are embedded in layers 505. Between each metal level an electrical insulating layer 506 which may comprise nitride material is formed. First and second passivation layers 508 and 510 extend in areas outside of the light sensitive areas. In the light sensitive areas, the first passivation layer is removed such that only the second passivation layer is provided having a thickness matched for anti-reflective behavior. In some embodiments, in addition to removing the first passivation layer, also a part of the metal stack may be removed. This avoids reflection of the incoming light which substantially take place at the isolation layers of the metal levels. The removal of the metal stack avoids that a significant part of the light does not reach the light sensitive region in the substrate and is lost for the signal.

Figure 5B:
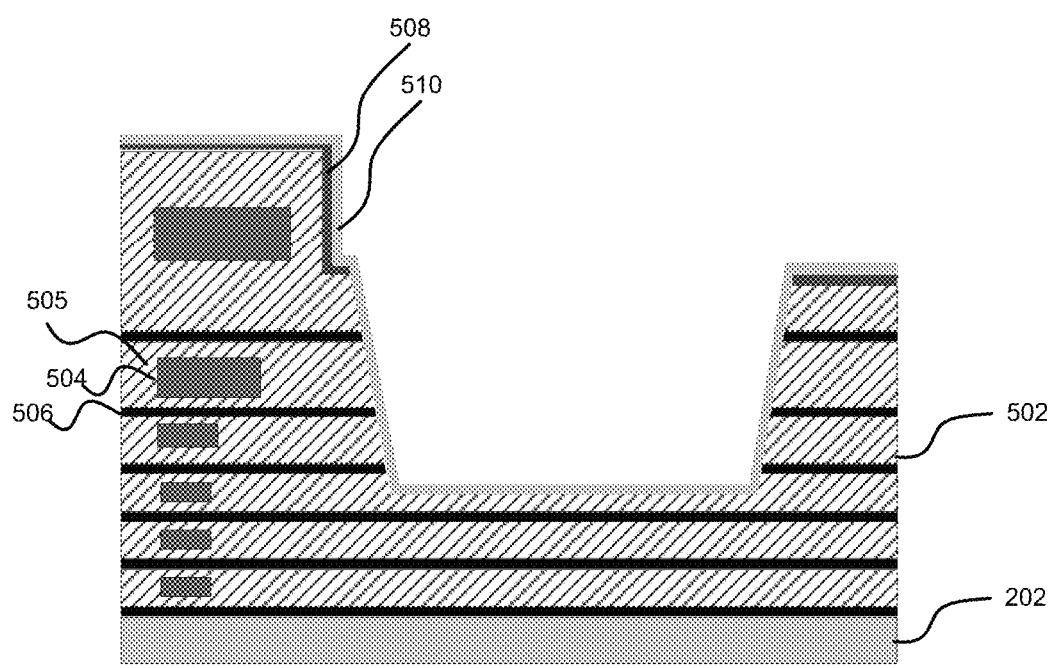

FIG. 5B shows an embodiment in which a part of the metal stack is removed in the light sensitive areas to reduce the reflection and absorption of light in the metal stack. As can be seen from FIG. 5B, only the second passivation layer 510 is provided in the area in which the metal stack is removed FIG. 5B shows the upper three of the layers 505 in which the metal layers 502 are formed being removed while three other layers 505 are remaining above the light sensitive area of the substrate 202.

Figure 5C:
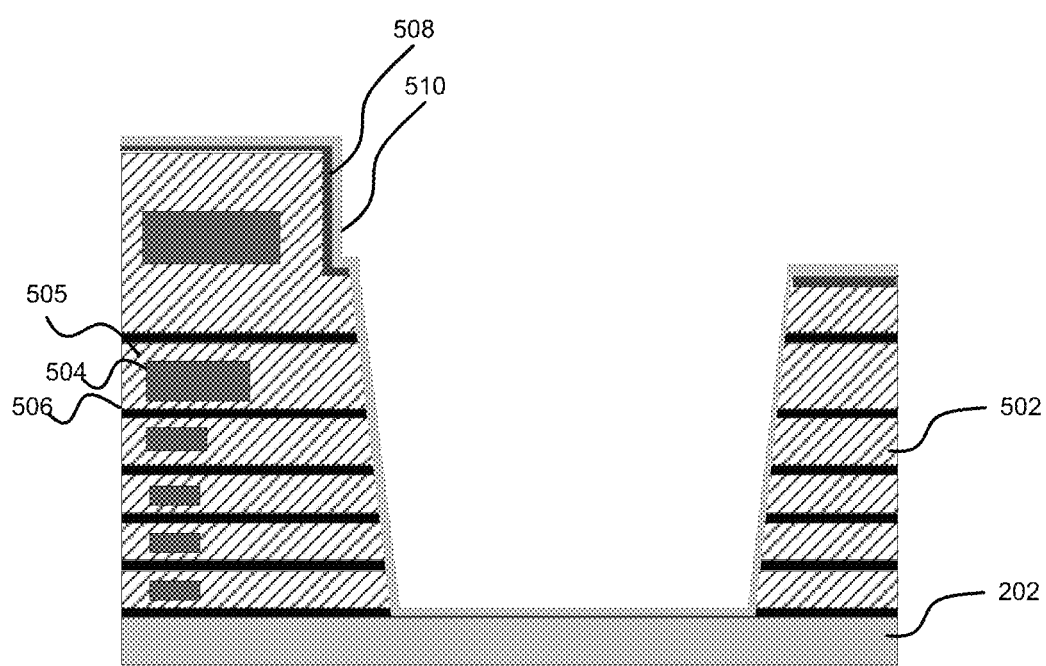

FIG. 5C shows an embodiment, in which all metal stack layers are removed in the light sensitive areas. Here the second passivation layer 510 extends on or close to the substrates surface, for example at a maximum distance from the substrate which is smaller than the vertical extension of the lowest metal level.

The embodiments shown in FIG. 5A-C may alone or in combination with the manufacturing process steps shown in FIGS. 3A-G and 4A-I provide a significant improvement of the efficiency of the imager device.

In some embodiments, a lens may be formed for each pixel. The lens may be formed from a photo-sensitive resist material such as Durimide. Such lenses have been tested to have good optical spectral behavior for infrared light which might be used for example in the depth imager shown in FIG. 2A. The photo-sensitive resist material allows convenient forming of the lenses by having the polyimide selectively irradiated. When applying a developer solution, the non-irradiated portions are removed. After the application of the developer the remaining structure is hard baked for example at about temperatures between 80 and 150° C.

Figure 6A:
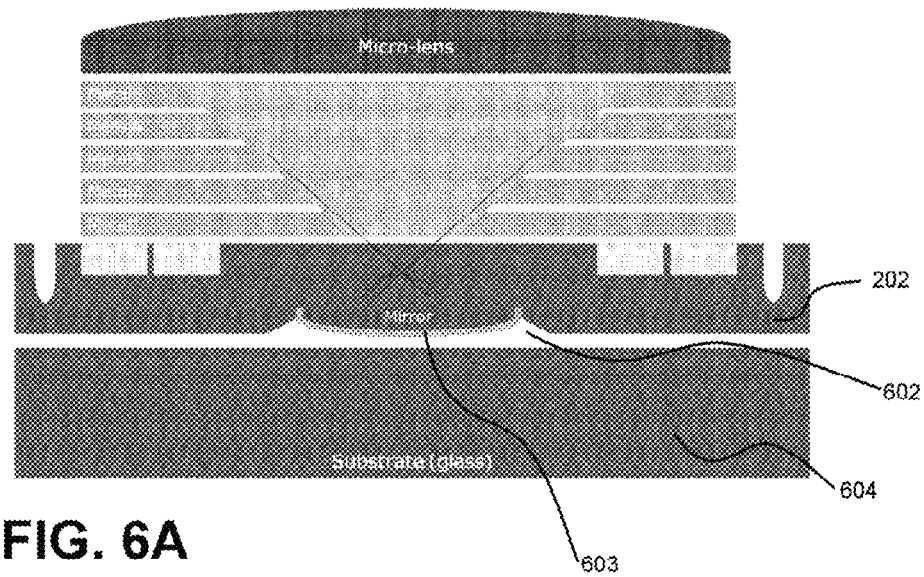
FIGS. 6A and 6B show schematic cross-sectional views according to an embodiment.
Figure 6B:
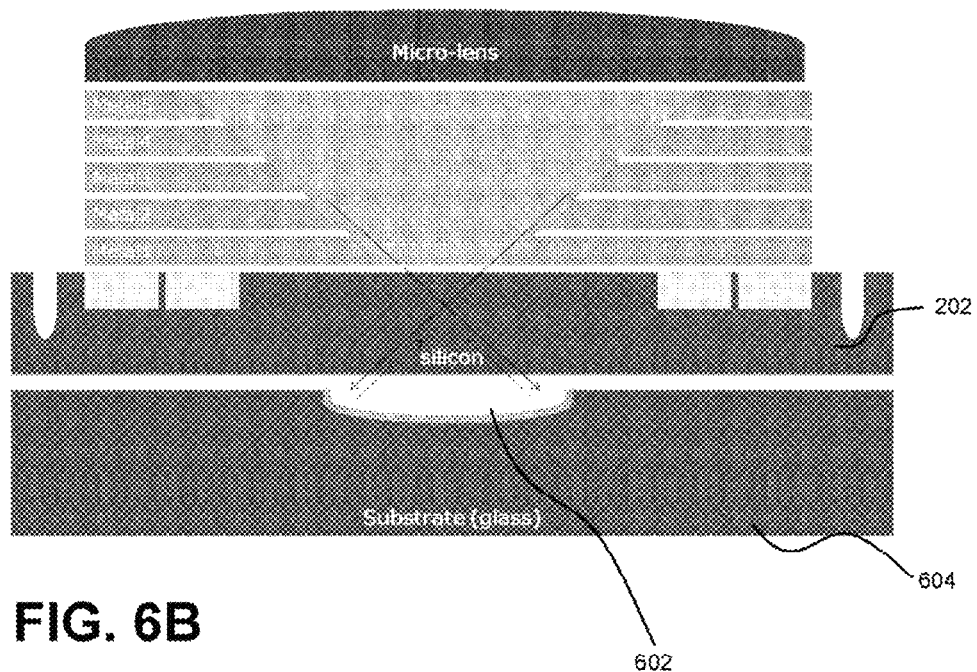

A further improvement of efficiency of the depth imager 200 can be obtained in some embodiments by providing for each pixel a reflection opposite to a respective lens provided for each pixel. The reflective structure provides a mirror for non-absorbed light and reflects back the light to concentrate in the pixel's photo-generation region. FIG. 6A shows an example in which a concave structure 602 is formed on the back side of the substrate 202 which is mounted to an external substrate 604 such as a glass substrate. Within the concave structure 602, a convex part 603 is formed which provides the focusing effect for the light reflected back to the photo-generation region. The convex part 603 may be fully or partially overlaid with a reflective layer such as a metal layer to provide good reflection. Light not absorbed in the light absorbing region is reflected by the reflective layer having a convex shape and directed back to the light absorbing regions in a focusing manner. In a further embodiment shown in FIG. 6B, the concave structure 602 may be formed on a separate substrate such as a glass plate on which the substrate 202 is mounted. A metal layer of concave shape is formed on a part or fully overlaying the concave structure 602. Light not absorbed in the light absorbing region is reflected by the reflective layer having a concave shape and directed back to the light absorbing regions in a focusing manner. It is to be understood that the embodiments of reflective structures shown in FIGS. 6A and 6B may be combined with any of the above described embodiments described with respect to FIGS. 3A-G, 4A-I and 5A-C.

Further enhancement in the sensitivity for depth imager sensors can be obtained by using a new doping concept as described below. In general, semiconductor doping technology is based on implementing differently doped (n and p) regions in order to provide a locally defined conductivity. Within n-regions, typically SB, AS or P, for p-regions, typically B (BF2) is doped into the substrate. Most significant is the ion implantation in which an accelerated atom stream is guided and introduced to the substrate. The area dose can be exactly defined by stream integration. After the implantation, the formerly perfect crystal is however severely damaged such that a usage is not immediately possible and annealing of the crystal at temperatures typically above 1000° C. and over many hours is required. A perfect annealing is however not possible and damages have to be tolerated. The higher the dose, the energy and the AMU (atomic molecular unit) is, the more damages occur and the more complex the damages are. Such damages typically result in leakage currents and other problems.

Figure 7A:
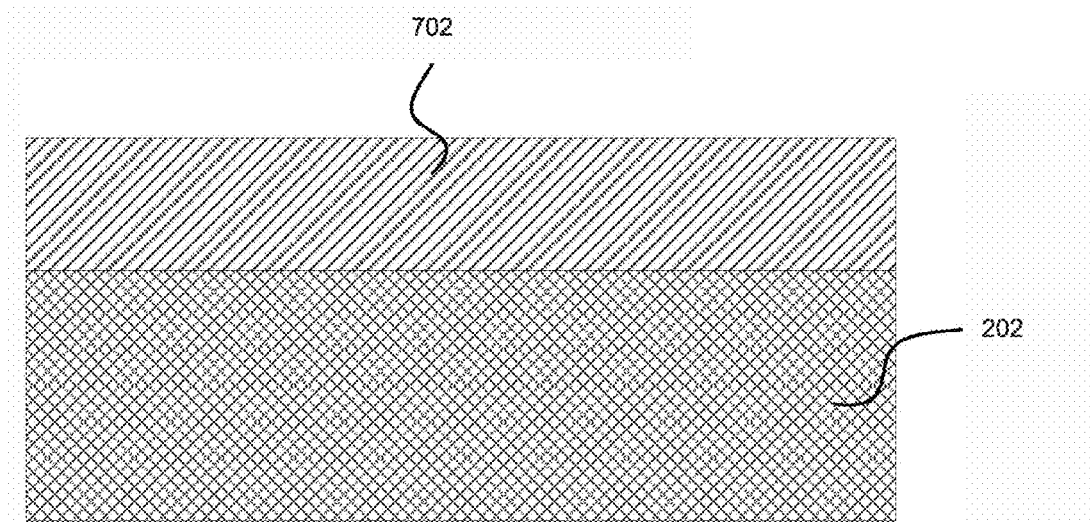
FIGS. 7A and 7B show schematic cross-sectional views according to an embodiment.
Figure 7B:
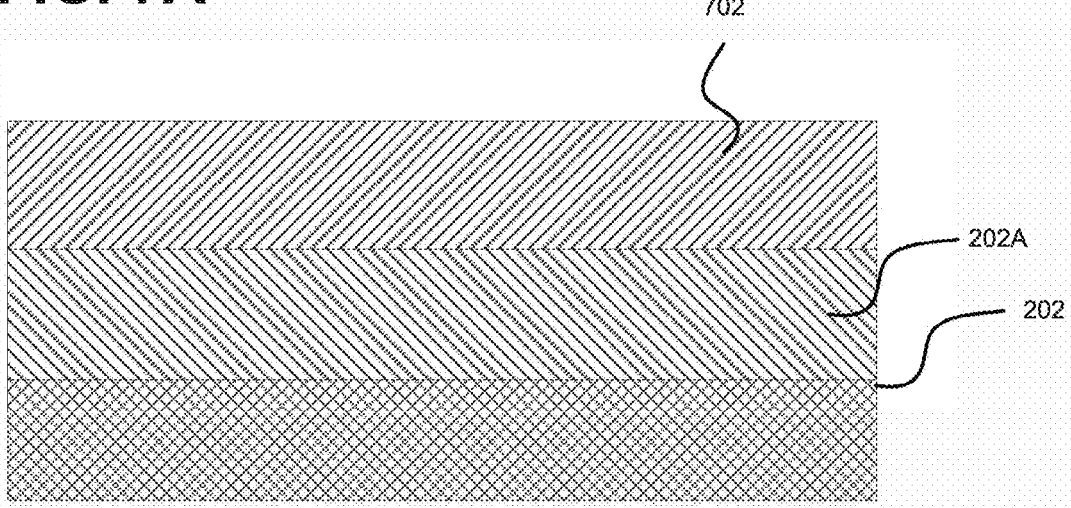

The present concept for obtaining a p-doping with improved performance and pixel efficiency for depth imagers and 3D sensors utilizes a different approach in which doping is achieved by a diffusion from a Bor doped glass layer (e.g. SiO2+B). The Bor doped glass layer is deposited over the substrate previous to the diffusion. In a reactor capable of silicon dioxide layer deposition, gas comprising Bor is added which results in a SiO2 layer comprising Bor. In some embodiments, the maximum concentration of Bor in the SiO2 layer may be below 20%, in some embodiments the maximum concentration of Bor in the SiO2 layer may be below 15% in some embodiments, the maximum concentration of Bor in the SiO2 layer may be at a value between 15% and 20%. FIG. 7A shows the substrate 202 prior to the doping. A layer 702 of Bor doped SiO2 is deposited over the substrate 202. Layer 702 may for example be deposited in a silicon dioxide reactor in which Bor gas is added. After the deposition of the Bor-doped silicon dioxide layer, the Bor-dopants are driven from the Bor-doped glass layer to the substrate 202. A heating process applied at temperatures above 1000° C. and for many hours is typically used to drive the Bor-dopants from the Bor-doped glass layer in the substrate 202. FIG. 7B shows the substrate after the drive-in process. A region 202A of high p-doping is generated in the substrate 202. The doped region 202A may have in some embodiments a cumulated doping concentration of 1015 cm-2 or more. In some embodiments, a peak doping concentration within the region 202A may have a value of 1019 cm-2 or more. In some embodiments, the peak doping concentration may include a value in the range between 1019 cm-2 and 1020 cm-2. In embodiments, the SiO2 layer may be removed afterwards and an epitaxial layer is grown above the highly doped substrate 202.

Figure 8:
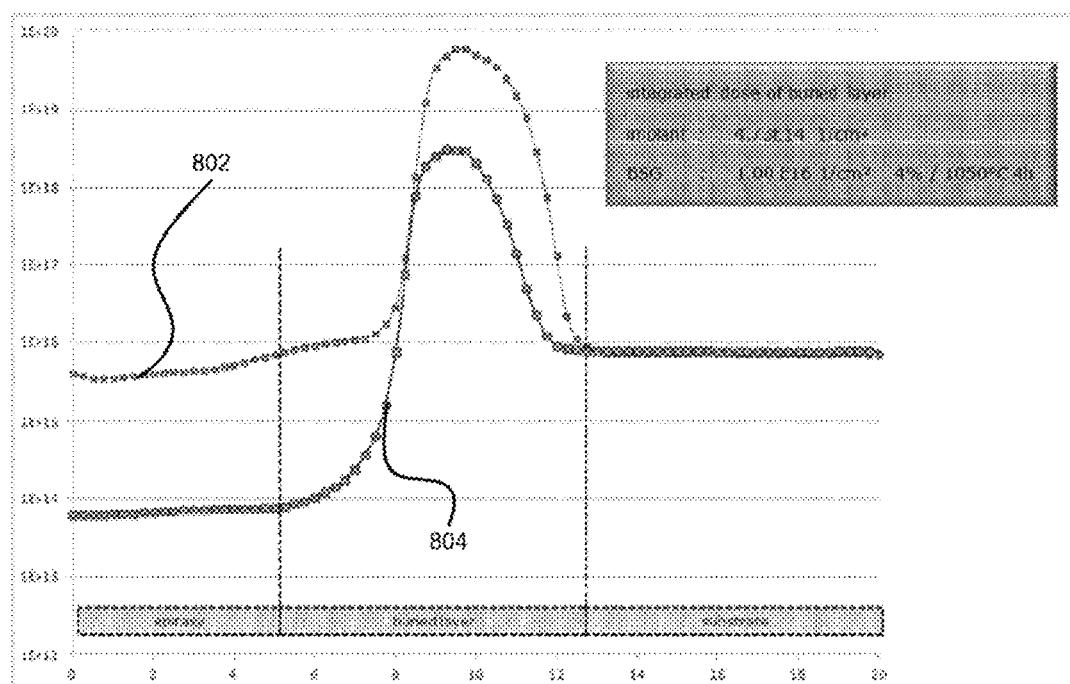
FIG. 8 shows doping profiles according to embodiments.

FIG. 8 shows a doping profile 802 with a dose of $1 \times 10^6$ $cm^{-2}$ resulting from diffusion from a Bor concentration of 4% within the SiO2 layer over 4 hours at a temperature of 1050° C. The ordinate of FIG. 8 show doping concentrations on a logarithm scale and the abscissa of FIG. 8 shows the layers extension in μm. For comparison, a doping profile with a dose of $4.7 \times 10^{14}$ $cm^{-2}$ resulting from an implant doping is shown in FIG. 8. The structure shown in FIG. 8 includes the substrate 202 with the doped region 202A and an epitaxial layer 202B grown above the doped region 202A after the respective doping processes have been applied. It is apparent that the doped region 202A being after the deposition of epitaxial layer 202B sandwiched at both sides by crystal semiconductor material forms in the structure of FIG. 8 a buried layer with high doping concentration. Such structures may be provided in some embodiments to obtain a specific doping profile such as, but not restricted to, a doping profile to generate build-in fields as described in co-owned U.S. provisional application 61/731,373, the content of which is incorporated herein in its full entirety.

It can be seen in FIG. 8 that the doping profile 802 resulting from the diffusion of the Bor doped $SiO_2$ glass layer 702 achieves a higher doping concentration with a peak doping concentration of almost up to 1020 $cm^{-2}$ compared to a profile 804 resulting from the implanted doping. The doping concentration with Bor doped $SiO_2$ layers thus allows achieving p-doping concentrations which are significantly above the p-doping concentrations which can be achieved by doped ion implantation with reasonably crystal defects. In addition, in view of the smoother method of doping, crystal defects are reduced resulting in less trapping of charge carriers and higher quantum efficiency for the imager.

Figure 9:
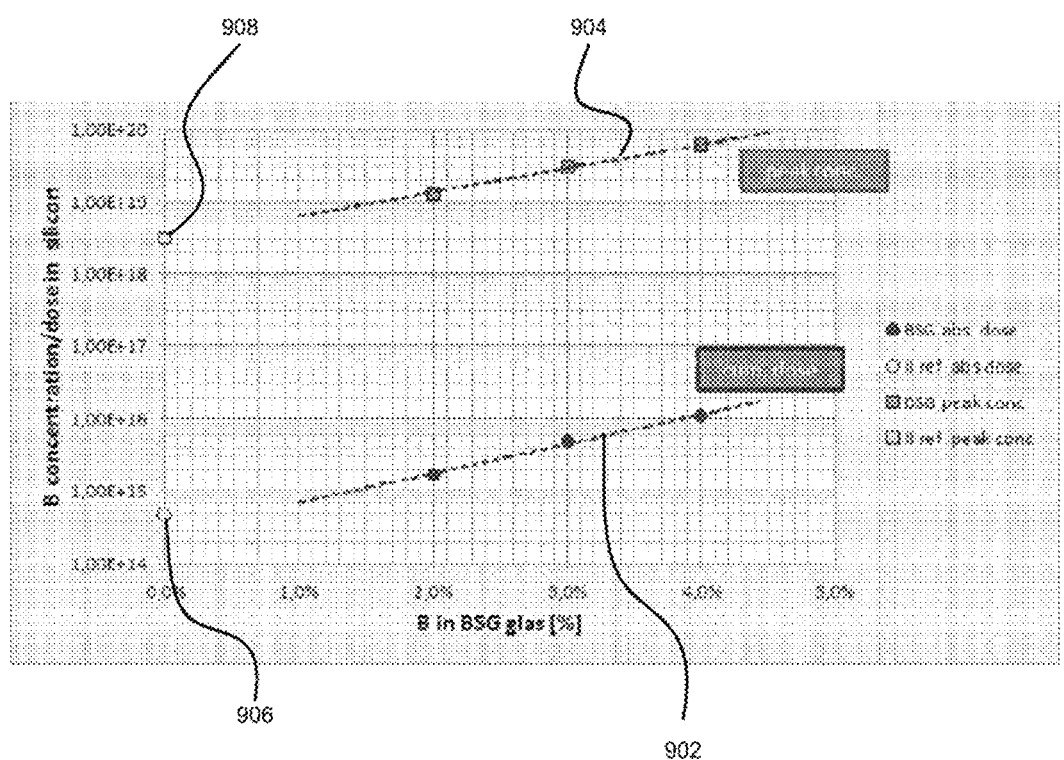
FIG. 9 shows a diagram of Bor concentrations in silicon versus Bor concentrations in a Bor-doped glass layer.

FIG. 9 shows a diagram wherein a relation of Bor doping concentrations in the Bor doped $SiO_2$ layer before diffusion (shown as weight percentage of $SiO_2$ on the abscissa) and Bor doping concentrations which are achieved after diffusion in the silicon substrate (shown in 1/$cm^2$ on the ordinate in logarithmic scale) is shown. In FIG. 9, a curve 902 shows a cumulative Bor dose concentration in silicon and a curve 904 shows a peak Bor doping concentration in silicon. It can be observed that ratios of peak concentration to cumulative dose (c_peak/c_cumul) can be achieved with values up to 4 decades (104) in a range of cumulative dose concentrations between about $8\times10^{14}$ cm$^{-2}$ and $2\times10^{16}$ cm$^{-2}$ (peak concentrations between about $6\times10^{18}$ cm$^{-2}$ and $1\times10^{20}$ cm$^{-2}$). The range of peak and cumulative Bor concentrations in the silicon can be varied by varying the concentration of Bor in the SiO$_2$ layer glass layer from 1% to 4.5%. to achieve cumulative dose concentrations between about $8\times10^{14}$ cm$^{-2}$ and $2\times10^{16}$ cm$^{-2}$ and peak concentrations between about $6\times10^{18}$ cm$^{-2}$ and $1\times10^{20}$ cm$^{-2}$. For comparison, a cumulative Bor dose concentration achievable with ion implantation is shown in the diagram of FIG. 9 with reference number 906 and a peak Bor concentration achievable with ion implantation is shown with reference number 908.

It becomes clear that the above described doping concept interacts in a synergetic manner with the described embodiments to avoid crystal defects which would increase light trapping and reduce efficiency of the depth imager devices. In particular, the concept for avoiding additional damages of the crystal semiconductor material during the further manufacturing such as described in FIGS. 3A to 3G provides a synergistic effect with the above described doping concept.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure. For example, while a manufacturing concept of an 3D TOF imager based on the photonic mixing principle has been described, it may be understood that the above concepts can also applied to the manufacturing of other 3D imagers such as 3D TOF imagers which are not based on the photon mixing concept. Furthermore, it may be understood that the described manufacturing concept may also be applicable to imagers in general which include for example also 2D imagers.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips or other semiconductors as well as logical units or physical implementations of protocol layers etc. Furthermore the terms "coupled" or "connected" may be interpreted in a broad sense not only covering direct but also indirect coupling.

It is further to be noted that embodiments described in combination with specific entities may in addition to an implementation in these entity also include one or more implementations in one or more sub-entities or sub-divisions of said described entity. For example, specific embodiments described herein described herein to be implemented in a transmitter or receiver may be implemented in sub-entities such as a chip or a circuit provided in such an entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

Furthermore, it is intended to include in this detailed description also one or more of described features, elements etc. in a reversed or interchanged manner unless otherwise noted.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A method of manufacturing a depth imager, comprising:
   providing a substrate having a light-sensitive area;
   forming on the substrate a metal layer stack; and
   depositing a passivation layer onto the metal layer stack, the passivation layer extending at least in an area over the light-sensitive area,
   wherein the passivation layer has a matched reduced thickness in the light-sensitive area to provide anti-reflective behavior with respect to the light-sensitive area.

2. The method of claim 1, wherein the act of depositing the passivation layer comprises:
   depositing a first passivation layer onto the metal layer stack in an area that is not over the light-sensitive area; and
   depositing a second passivation layer formed onto the first passivation layer and onto the area of the metal layer stack that is over the light-sensitive area.

3. The method of claim 1, wherein the act of forming the metal layer stack comprises forming the metal layer stack having a plurality of metal layers, with fewer of the plurality of metal layers in the area over the light-sensitive area.

4. The method of claim 1, wherein the act of metal layer stack the metal layer stack comprises forming the metal layer stack having a plurality of metal layers, and further comprising:
   forming an electrical insulating layer between each of the plurality of metal layers.

5. The method of claim 4, wherein the act of forming the electrical insulating layer between each of the plurality of metal layers includes forming each of the electrical insulating layers with a nitride material.

6. The method of claim 1, wherein the act of forming the metal layer stack comprises forming the metal layer stack having a reduced thickness in the light-sensitive area to prevent, in conjunction with the passivation layer having a matched reduced thickness in the light-sensitive area, reflections of incoming light occurring at isolation layers of metal layers within the metal layer stack.

7. The method of claim 1, wherein the act of forming the metal layer stack comprises forming the metal layer stack having metal layers that are substantially uniform with respect to one another in the light-sensitive area.

8. A method of manufacturing a depth imager, comprising:
   providing a substrate having a light-sensitive area;
   forming on the substrate a metal layer stack comprising a plurality of metal layers;
   depositing a first passivation layer on the metal layer stack;
   removing at least a part of the metal layer stack and the first passivation layer in an area over the light-sensitive area; and
   depositing a second passivation layer onto the first passivation layer and onto the area that is over the light-sensitive area,
   wherein the second passivation layer has a matched reduced thickness in the area over light-sensitive area to provide anti-reflective behavior with respect to the light-sensitive area.

9. The method of claim 8, wherein the act of forming the metal layer stack includes forming the metal layer stack having a plurality of metal layers, and
   wherein the act of removing at least a part of the metal layer stack includes removing at least one of the plurality of metal layers in the area above the light-sensitive area.

10. The method of claim 9, wherein the act of removing at least a part of the metal layer stack includes removing all of the plurality of metal layers in the area above the light-sensitive area.

* * * * *